US 6,657,499 B2

(12) United States Patent
Lin

(10) Patent No.: US 6,657,499 B2
(45) Date of Patent: Dec. 2, 2003

(54) METHOD AND CIRCUIT FOR CONTROLLING POWER AMPLIFIERS

(75) Inventor: Allan Ming-Lun Lin, Fremont, CA (US)

(73) Assignee: Xicor, Inc., Milpitas, CA (US)

( * ) Notice: Subject to any disclaimer, the term of this patent is extended or adjusted under 35 U.S.C. 154(b) by 0 days.

(21) Appl. No.: 10/054,703

(22) Filed: Jan. 18, 2002

(65) Prior Publication Data

US 2003/0137355 A1 Jul. 24, 2003

(51) Int. Cl.[7] ............................................... H03F 3/04
(52) U.S. Cl. ...................... 330/296; 330/285; 330/298
(58) Field of Search ................................ 330/285, 296, 330/298

(56) References Cited

U.S. PATENT DOCUMENTS 5,488,331 A * 1/1996 Keane et al. ............... 330/296
6,417,729 B1 * 7/2002 Lemay et al. .............. 330/129
2002/0115395 A1 * 10/2002 Wojslaw .................... 330/296

* cited by examiner

Primary Examiner—Michael B Shingleton
(74) Attorney, Agent, or Firm—Fish & Richardson P.C.

(57) ABSTRACT

A bias controller includes a bias detector, a reference comparator, a memory component, and a reference voltage. The bias detector is operable to detect a bias current associated with a device controlled by the bias controller and produce a proportional sensed bias voltage. The reference comparator is operable to compare the bias voltage to a reference voltage and produce a first control signal operable to adjust a bias output of the bias controller. The memory component stores a plurality of reference voltage settings, one for each mode of operation of the device, the memory component including a mode setting input and a reference voltage output signal. The reference voltage adjustment circuit adjusts the reference voltage applied to the reference comparator in accordance with the mode of the device as controlled by the reference voltage output signal.

20 Claims, 8 Drawing Sheets

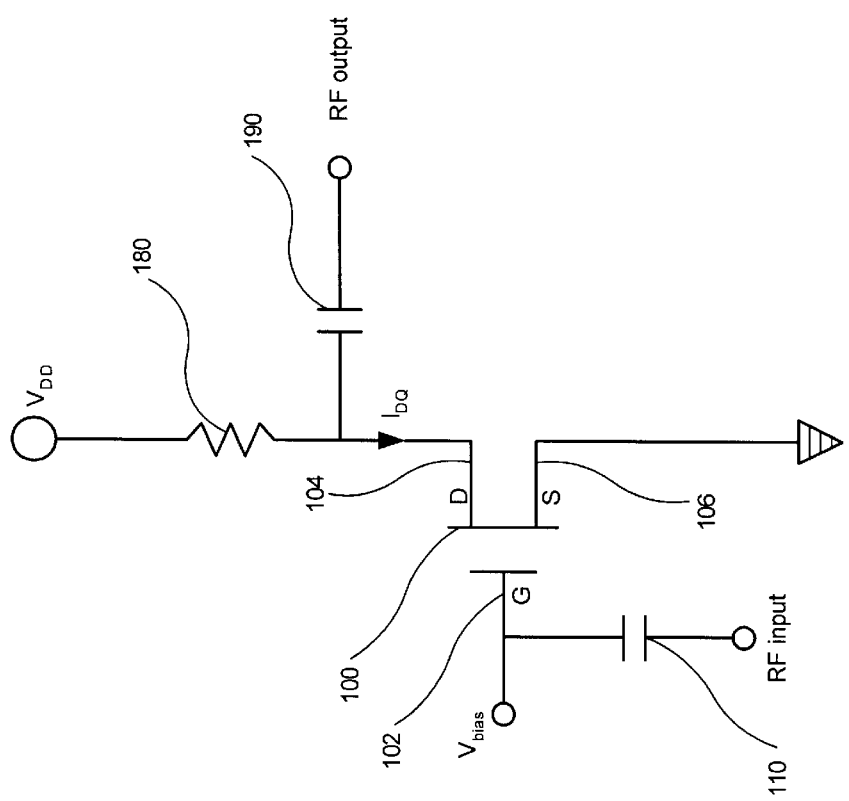
Fig. 1: Prior Art

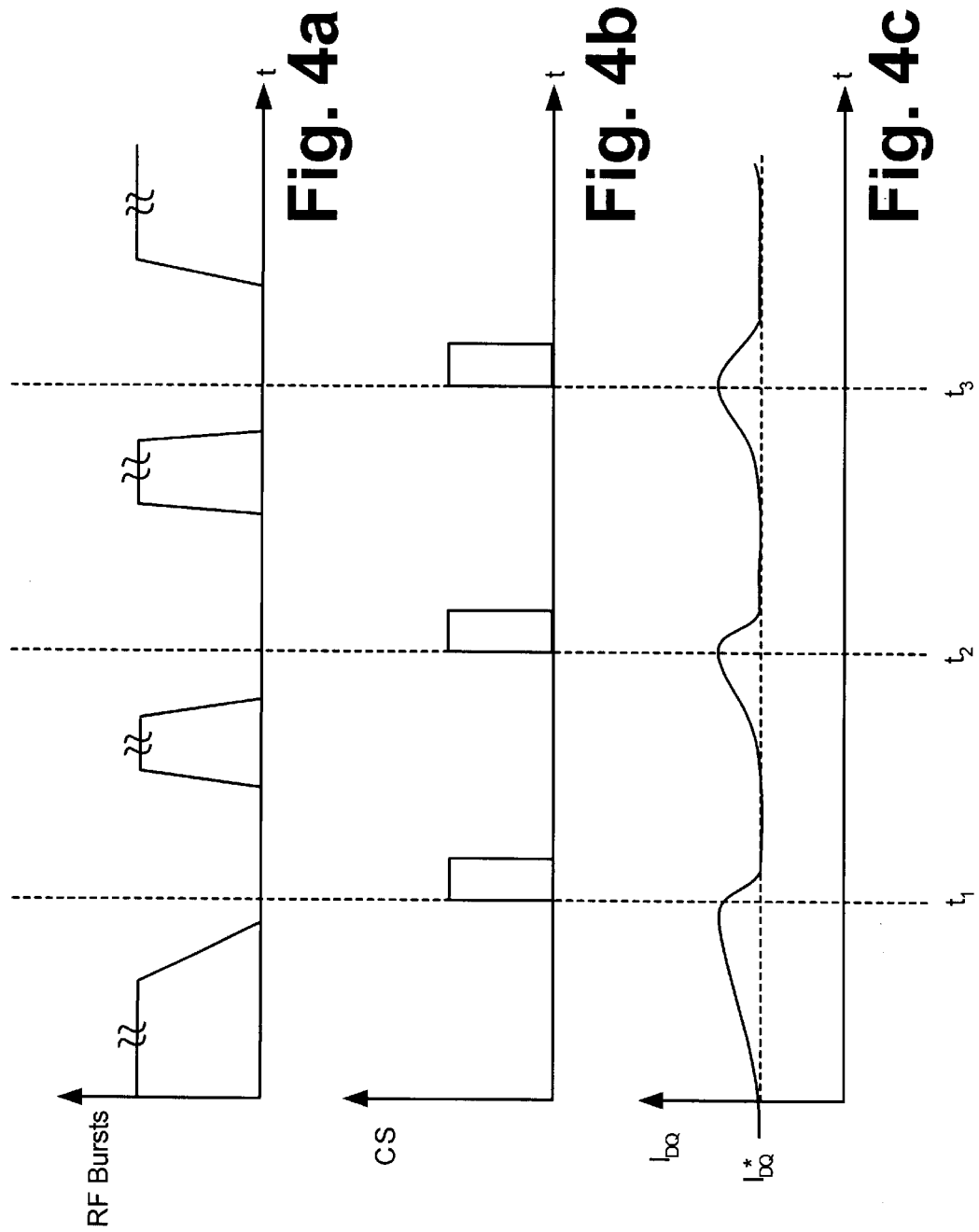

METHOD AND CIRCUIT FOR CONTROLLING POWER AMPLIFIERS

BACKGROUND OF THE INVENTION

Power amplifiers are widely used in communication systems. Radio Frequency (RF) amplifiers, in particular, are widely used in wireless communication systems. For example, FIG. 1 shows a Field Effect Transistor (FET) based power amplifier. The amplifier includes FET 100 with gate 102, drain 104, and source 106. Gate 102 is DC biased with bias voltage $V_{bias}$. Drain 104 is connected to voltage $V_{DD}$ through resistor 180. Source 106 is connected to a common ground. RF input is coupled to gate 102 through capacitor 110. RF output is coupled to drain 104 through capacitor 190. The current flowing into drain 104 is active drain current $I_{DA}$. When little or no RF input is coupled to gate 102, the current $I_{DD}$ flowing into drain 104 is quiescent drain current $I_{DQ}$.

FIG. 2 shows drain current $I_{DD}$ as a function of gate voltage $V_{gg}$. In general, drain current $I_{DD}$ increases with gate voltage $V_{gg}$. When bias voltage $V_{bias}$ is applied to gate 102 with no RF input, drain current $I_{DD}$ is equal to quiescent current $I_{DQ}$. $I_{DQ}$ changes with temperature and over time with aging.

SUMMARY OF THE INVENTION

In one aspect, the invention provides a bias controller. The bias controller includes a bias detector, a reference comparator, a memory component, and a reference voltage. The bias detector is operable to detect a bias current associated with a device controlled by the bias controller and produce a proportional sensed bias voltage. The reference comparator is operable to compare the bias voltage to a reference voltage and produce a first control signal operable to adjust a bias output of the bias controller. The memory component stores a plurality of reference voltage settings, one for each mode of operation of the device. The memory component includes a mode setting input and a reference voltage output signal. The reference voltage adjustment circuit adjusts the reference voltage applied to the reference comparator in accordance with the mode of the device as controlled by the reference voltage output signal.

In another aspect, the invention provides a bias controller including a memory component and a potentiometer. The memory component stores a plurality of bias voltage settings, one for each mode of operation of the device. The memory component includes a mode setting input and a bias voltage output signal. The potentiometer has a control configured to receive the bias voltage output signal and adjusts a wiper position of the potentiometer to produce a control signal operable to adjust a bias of the bias controller.

In another aspect, the invention provides a bias controller and includes a bias detector, a reference comparator, a memory component, a reference voltage, a bias voltage and a controller. The bias detector is operable to detect a bias current associated with a device controlled by the bias controller and produces a proportional sensed bias voltage. The reference comparator is operable to compare the bias voltage to a reference voltage and produce a first control signal operable to adjust a bias output of the bias controller. The memory component stores a plurality of reference voltage settings and bias voltage settings, one of each for each mode of operation of the device. The reference voltage adjustment circuit adjusts the reference voltage applied to the reference comparator in accordance with the mode of the device as controlled by the reference voltage output signal. The bias voltage adjustment circuit adjusts the bias voltage applied to the device in accordance with the mode of the device. The controller has a mode selection input and is operable to receive a mode selection and identify and associate bias and reference voltage settings and provide an adjustment signal to one or more of the reference and bias voltage adjustment circuits.

Aspects of the invention can include one or more of the following advantages. The FET can be automatically biased and calibrated. The set up process during the manufacturing of power amplifiers can be simplified. The calibration process can be controlled though a digital interface to reduce design time and effort. The device can include an integrated temperature compensation circuit. Alarm functions can be integrated to improve system reliability and to provide advanced warning for power failure. Other advantages will be readily apparent from the attached figures and the description below.

BRIEF DESCRIPTION OF THE DRAWINGS

FIG. 1 shows a Prior Art RF amplifier with an FET.

FIG. 4a shows RF bursts as a function of time.

FIG. 4b shows the control signal on the chip select input as a function of time.

FIG. 4c shows the difference between the quiescent current and the target quiescent current as a function of time.

DETAILED DESCRIPTION OF THE INVENTION

The present invention relates to method and apparatus for controlling power amplifiers. The following description is presented to enable one of ordinary skill in the art to make and use the invention and is provided in the context of a patent application and its requirements. Various modifications to the invention will be readily apparent to those skilled in the art and the generic principles herein may be applied to other embodiments. Thus, the present invention is not intended to be limited to the embodiments shown, but is to be accorded the widest scope consistent with the principles and features described herein.

The present invention will be described in terms of a circuit having specific components having a specific configuration. However, one of ordinary skill in the art will readily recognize that this method and system will operate effectively for other components having similar properties, other configurations, and other relationships between components.

When an FET is used in an RF power amplifier, the performance of the RF power amplifier is typically determined by how quiescent current $I_{DQ}$ is selected or controlled. Some of the performance characteristics that may relate to $I_{DQ}$ include one or more of the following: linearity, inter-modulation distortion, peak-to-average power ratio, maximum output power, DC power efficiency, third order intercept point, harmonic emissions and spurious emissions.

Different applications may require a different quiescent current $I_{DQ}$. In certain applications, it is desirable to keep quiescent current $I_{DQ}$ substantially as a constant, once a target quiescent current $I_{DQ}$ ($I_{DQ}*$) is selected.

Figure 2A:
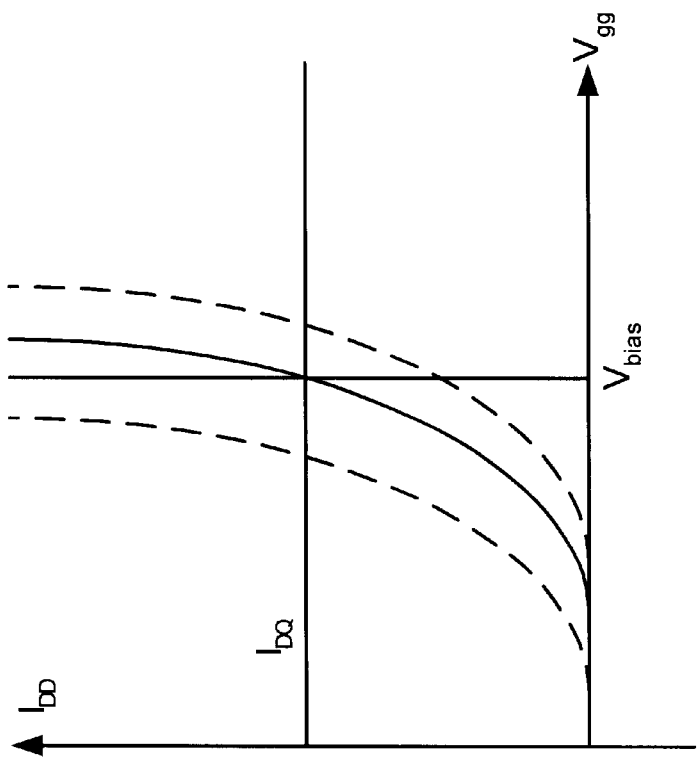
FIG. 2a shows the drain current and variation of drain current due to temperature and process variation.
Figure 2B:
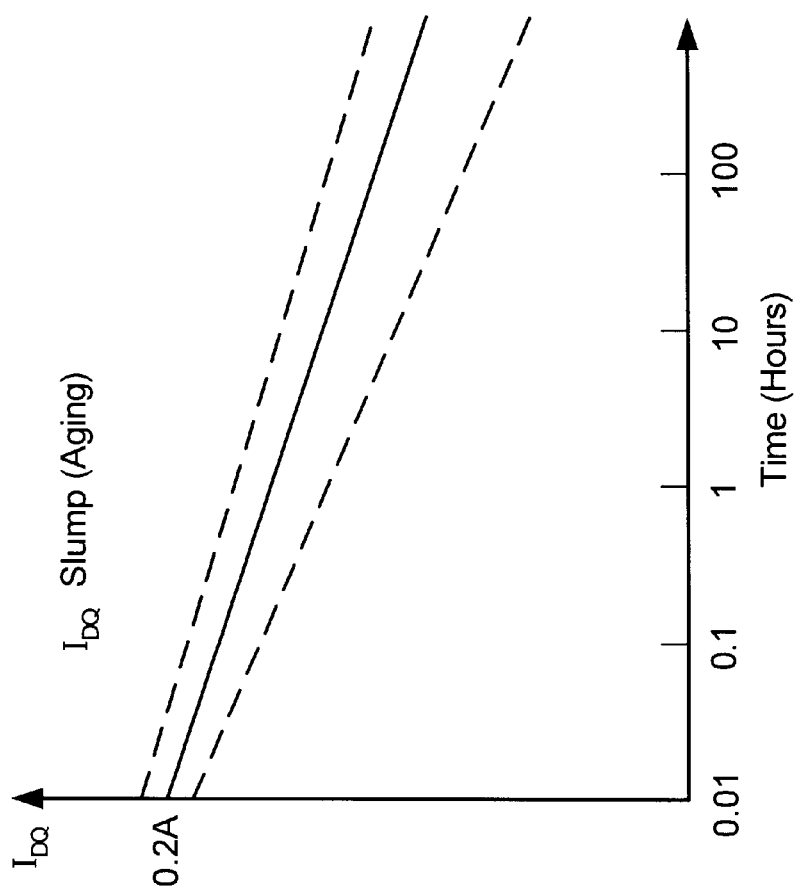
FIG. 2b shows the drain current of the FET of FIG. 1 at a fixed gate voltage $V_{gg}$ over time.

For certain types of FETs (e.g., LDMOS Power FETs), a special circuit can be required to keep the quiescent current $I_{DQ}$ substantially constant. The quiescent current $I_{DQ}$ for a given and fixed bias voltage $V_{bias}$ changes with temperature of the FET. The temperature of a FET can change when the ambient temperature changes or as the operating RF power of the FET changes. $I_{DQ}$ for a given and fixed bias voltage $V_{bias}$ also declines over time due to aging effects in the FET (e.g., LDMOS) device. The decline is referred to as $I_{DQ}$ drift or $I_{DQ}$ slump (see FIG. 2b).

Some methods and circuits for controlling the quiescent current $I_{DQ}$ of a FET have already been described in U.S. patent application Ser. No. 09/838,531, filed on Apr. 18, 2001, entitled "Amplifier Bias Control Circuit," the entire disclosure of which is expressly incorporated by reference.

Figure 3:
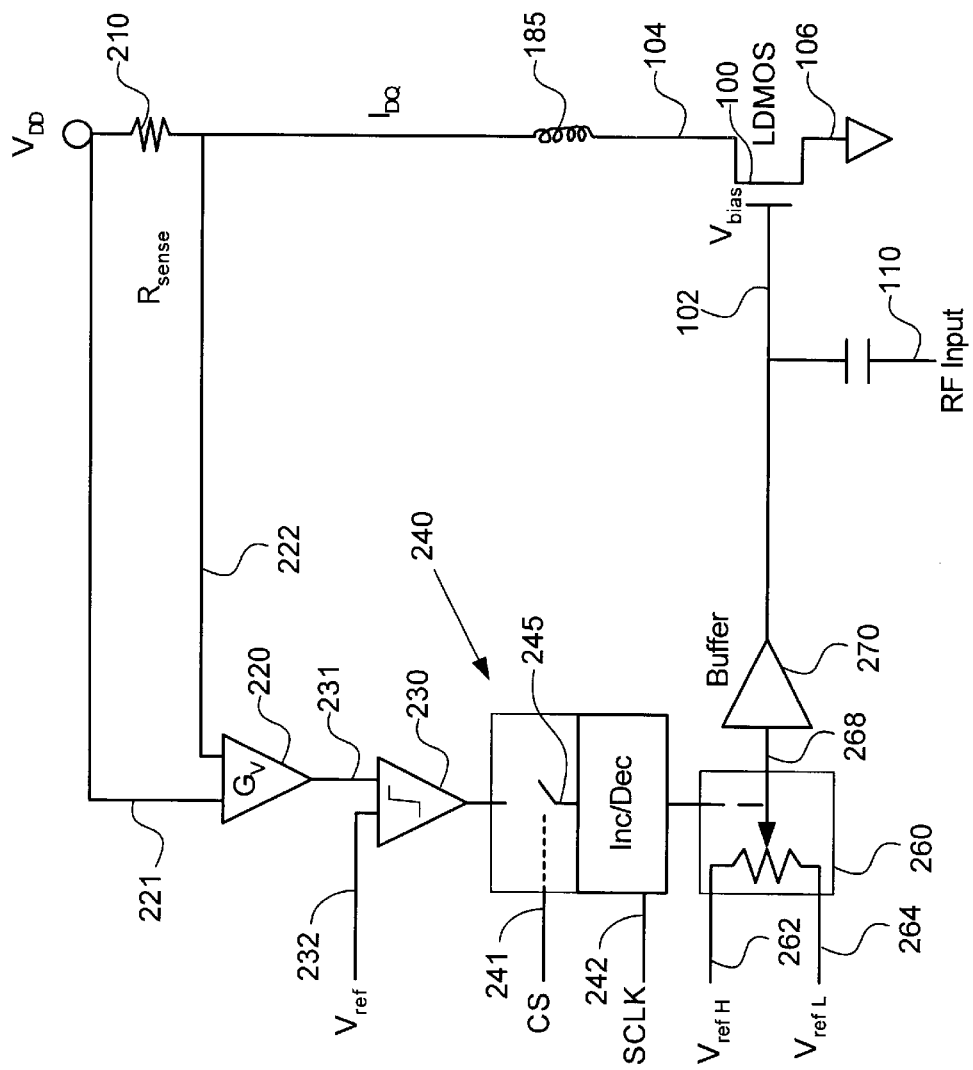
FIG. 3 shows an FET control circuit that can be operated in open mode, closed mode, or dynamic mode.

FIG. 3 shows one implementation of a FET control circuit can be used to keep a quiescent current $I_{DQ}$ of an FET substantially constant. FET 100 includes a gate 102, a drain 104, and a source 106. Gate 102 is DC biased with a bias voltage $V_{bias}$ and coupled with an RF input through capacitor 110. Source 106 is connected to the common ground. Drain 104 is coupled to an input voltage $V_{DD}$ through an effective load 185 and a sensing resistor 210. Sensing resistor 210 can be used to measure the average active current $I_{DA}$ during the time when the RF signal is coupled to gate 102.

Sensing resistor 210 is coupled to an instrumentation amplifier 220. The two inputs of the instrumentation amplifier 220 are connected across sensing resistor 210. The output of instrumentation amplifier 220 is connected to a first input 231 of a comparator 230. A reference voltage $V_{ref}$ is connected to a second input 232 of comparator 230.

Assuming that sensing resistor 210 has a resistance of $R_{sense}$ and that instrumentation amplifier 220 has a voltage gain of $G_V$, then the voltage at the output of instrumentation amplifier 220 is $VI_{DQ}=I_{DQ} R_{sense} G_V$ where $I_{DQ}$ is the quiescent current of FET 100. When quiescent current $I_{DQ}$ is larger than $V_{ref}/(R_{sense} G_V)$, then the output of comparator 230 has a first value. When quiescent current $I_{DQ}$ is smaller than $V_{ref}/(R_{sense}G_V)$, then the output of comparator 230 has a second value. In one implementation of comparator 230, the first value is high, and the second value is low.

The output of comparator 230 is coupled to a bias-controller 240. Bias-controller 240 is used to control a digital potentiometer 260. Bias-controller 240 includes a chip select input 241, a slew-rate input 242 and Increment/Decrement (Inc/Dec) logic 245.

Chip select input 241 enables or disables Inc/Dec logic 245. When chip select input 241 is in a first state, the Inc/Dec logic 245 is disabled and the output from comparator 230 does not effect the state of the digital potentiometer 260. Alternatively, when chip select input 241 is in a second state, the Inc/Dec logic 245 is enabled and the comparator 230 can change the state of digital potentiometer 260. The output from comparator 230 determines whether the effective resistance of digital potentiometer 260 will increase, decrease, or remain unchanged. Slew-rate input 242 determines how fast digital potentiometer 260 changes state. The signal coupled to slew-rate input 242 can be in the form of a clock signal.

Digital potentiometer 260 can include a high voltage reference 262, a low voltage reference 264, and an output 268. The voltages set at high voltage reference 262 and low voltage references 264 determine the possible range of the voltage at output 268.

When the output from comparator 230 is high, Inc/Dec logic 245 is enabled, and slew rate input 242 is clocked, then the voltage at output 268 increases. When the output from comparator 230 is low, Inc/Dec logic 245 is enabled and slew rate control 242 is clocked, the voltage at output 268 decreases. In one implementation, the voltage at output 268 changes with a rate determined by the clock rate of the clock signal at slew rate input 242.

Output 268 of digital potentiometer 260 is coupled to a buffer 270. The output of buffer 270 sets the bias voltage $V_{bias}$ at gate 102 of FET 100. In one implementation, buffer 270 has a voltage gain of one, and bias voltage $V_{bias}$ is the same as the voltage at the output 268 of digital potentiometer 260. Alternatively, buffer 270 has a voltage gain other than one.

The circuit in FIG. 3 can be used to control FET 100 in an open mode, in a closed mode, and in a dynamic mode. In the open mode, Inc/Dec logic 245 is disabled and bias voltage $V_{bias}$ is set by digital potentiometer 260. In the closed mode, Inc/Dec logic 245 is enabled and quiescent current $I_{DQ}$ is set by the reference voltage $V_{ref}$ at input 232 of comparator 230. In the dynamic mode, Inc/Dec logic 245 is enabled for one or more time intervals and disabled for other time intervals.

FIGS. 4a, 4b and 4c illustrate how the dynamic mode can be used in RF amplifying applications. As shown in FIG. 4a, in certain RF amplifying applications, such as TDMA, the RF signals are applied to FET 100 in the form of a series of short RF bursts. As shown in FIG. 4b, control signal CS can be applied to chip select input 241 of bias-controller 240 to enable Inc/Dec logic 245 for a predetermined time period (e.g., t1, t2, and t3) when the RF signal is at or below a first threshold (e.g., little or no RF signal). As shown in FIG. 4c, when control signal CS is applied to chip select input 241 and Inc/Dec logic 245 is enabled, the quiescent current $I_{DQ}$ moves toward the target quiescent current $I_{DQ}*$ at a rate determined by slew rate input 242. As shown also in FIG. 4c, when control signal CS is not applied to chip select input 241 and Inc/Dec logic 245 is disabled, the quiescent current $I_{DQ}$ can deviate from the target quiescent current $I_{DQ}*$. Because Inc/Dec logic 245 is periodically or intermittently enabled, the quiescent current $I_{DQ}$ is repetitively set to the target quiescent current $I_{DQ}*$. Consequently, the quiescent current $I_{DQ}$ is maintained substantially equal to the target quiescent current $I_{DQ}*$.

Figure 5A:
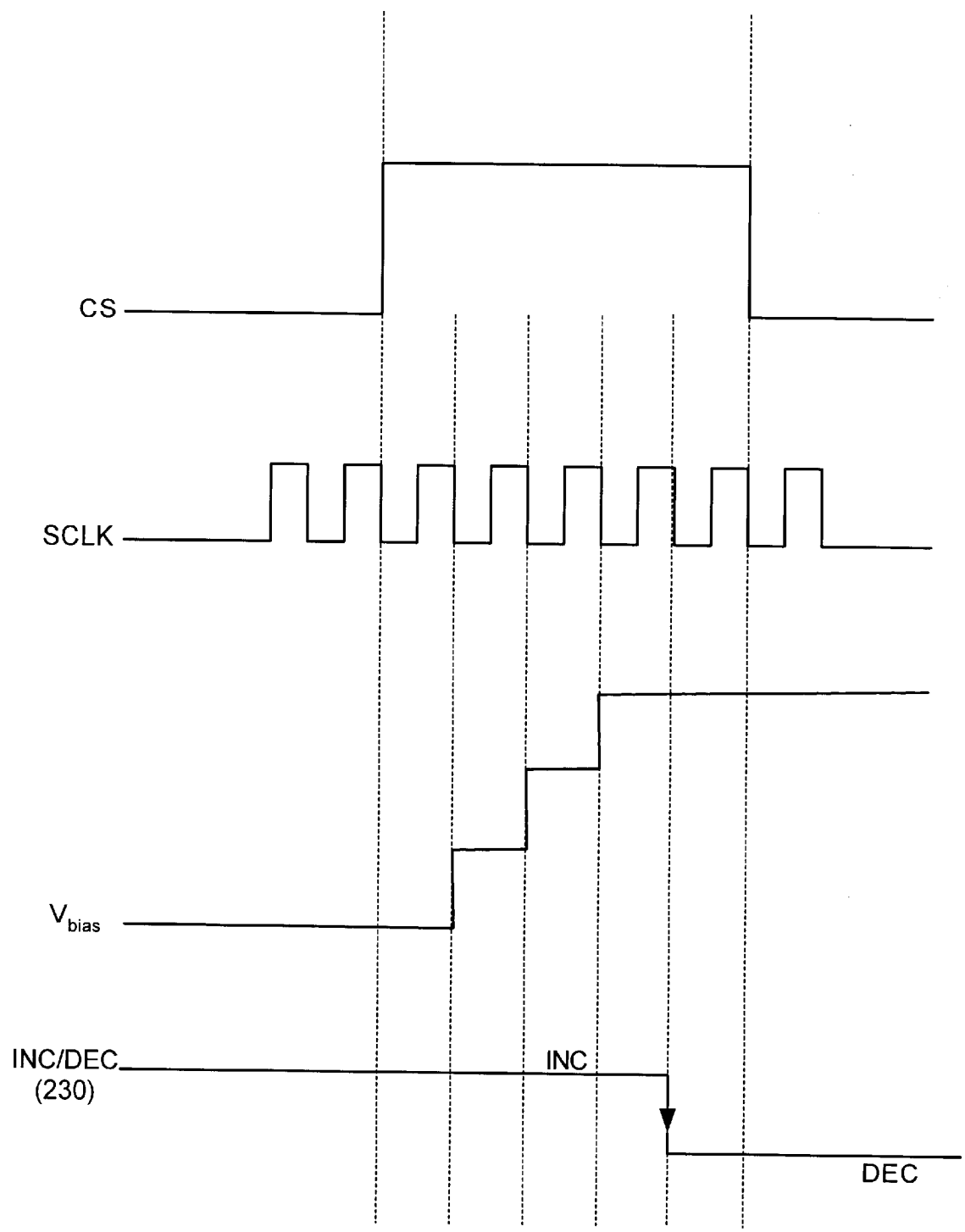
FIGS. 5a and 5b show a detailed view of the $I_{DQ}$ calibration cycle.

FIG. 5a shows the operation of the Inc/Dec logic 245 in more detail. A calibration cycle starts when a control signal CS is applied to chip select input 241 and Inc/Dec logic 245 is enabled. When slew rate input 242 is clocked, and the output of comparator 230 is high, the Inc/Dec logic 245 increments the digital potentiometer 260 which increases the voltage at output 268.

As previously described, when the voltage output 268 increases, the bias voltage $V_{bias}$ on the FET (e.g., LDMOS) transistor gate 102 increases, which increases $I_{DQ}$. This increases the voltage across sense resistor 210, which raises the output voltage of instrumentation amplifier 220. If the output voltage& is below $V_{ref}$, the output of comparator 230 will be maintained at a high level and on the next clock cycle received at slew rate input 242, the Inc/Dec logic 245 increases the resistance of the digital potentiometer 260 again. Alternatively, if the output voltage of instrumentation amplifier 220 has been raised above the $V_{ref}$, the output of comparator 230 will be low. The Inc/Dec logic 245 detects a low state and disables further changes in digital potentiometer 260 which locks $V_{bias}$ at the target $V_{ref}$ level. A calibration cycle is completed when control signal CS disables the Inc/Dec logic 245.

Figure 5B:
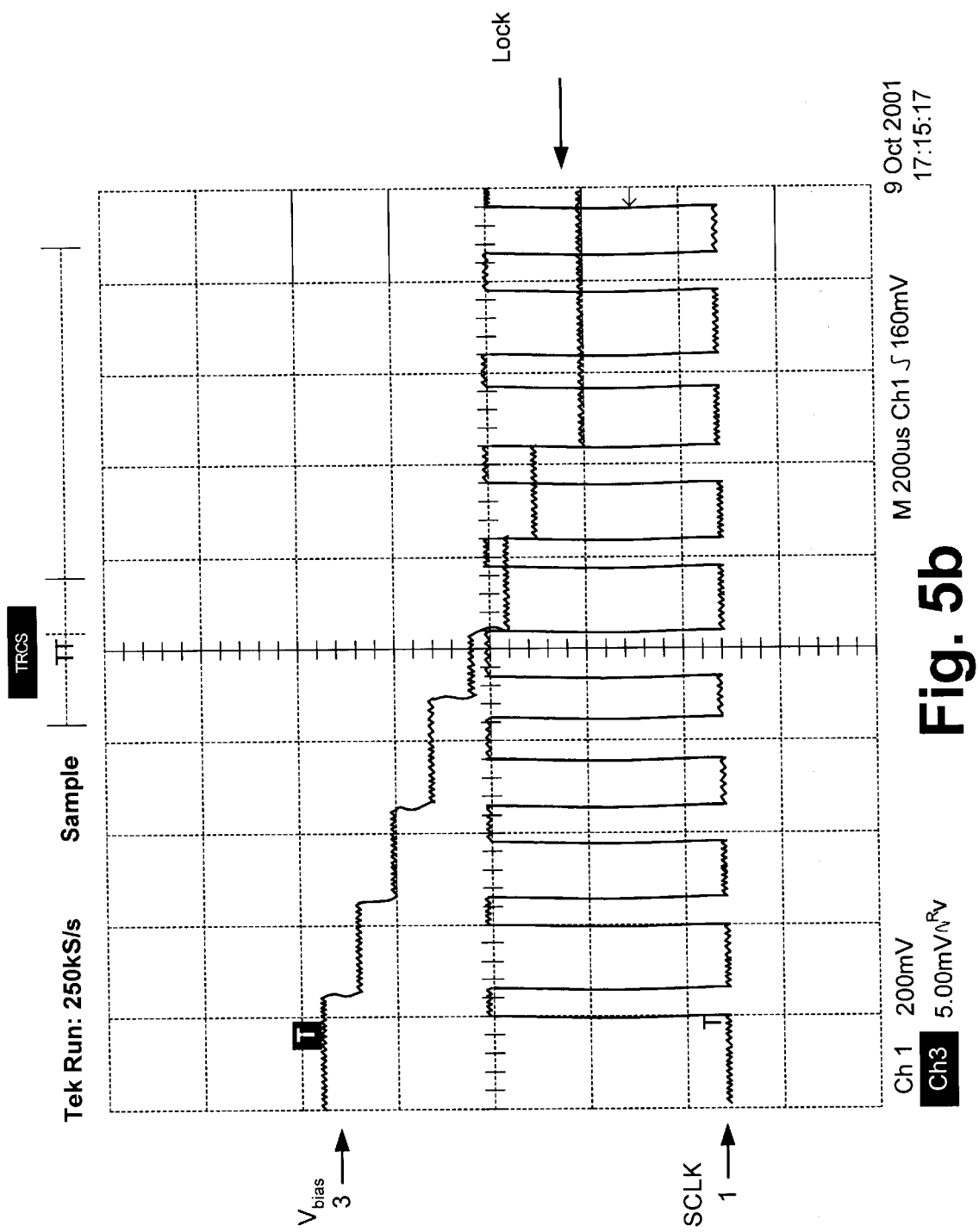

As shown in FIG. 5b, the calibration cycle works similarly to reduce when $V_{bias}$ is above the target $V_{ref}$ level. The rate at which the digital potentiometer 260 changes $V_{bias}$ is controlled by the frequency of the clock signal on slew rate input 242.

Figure 4D:
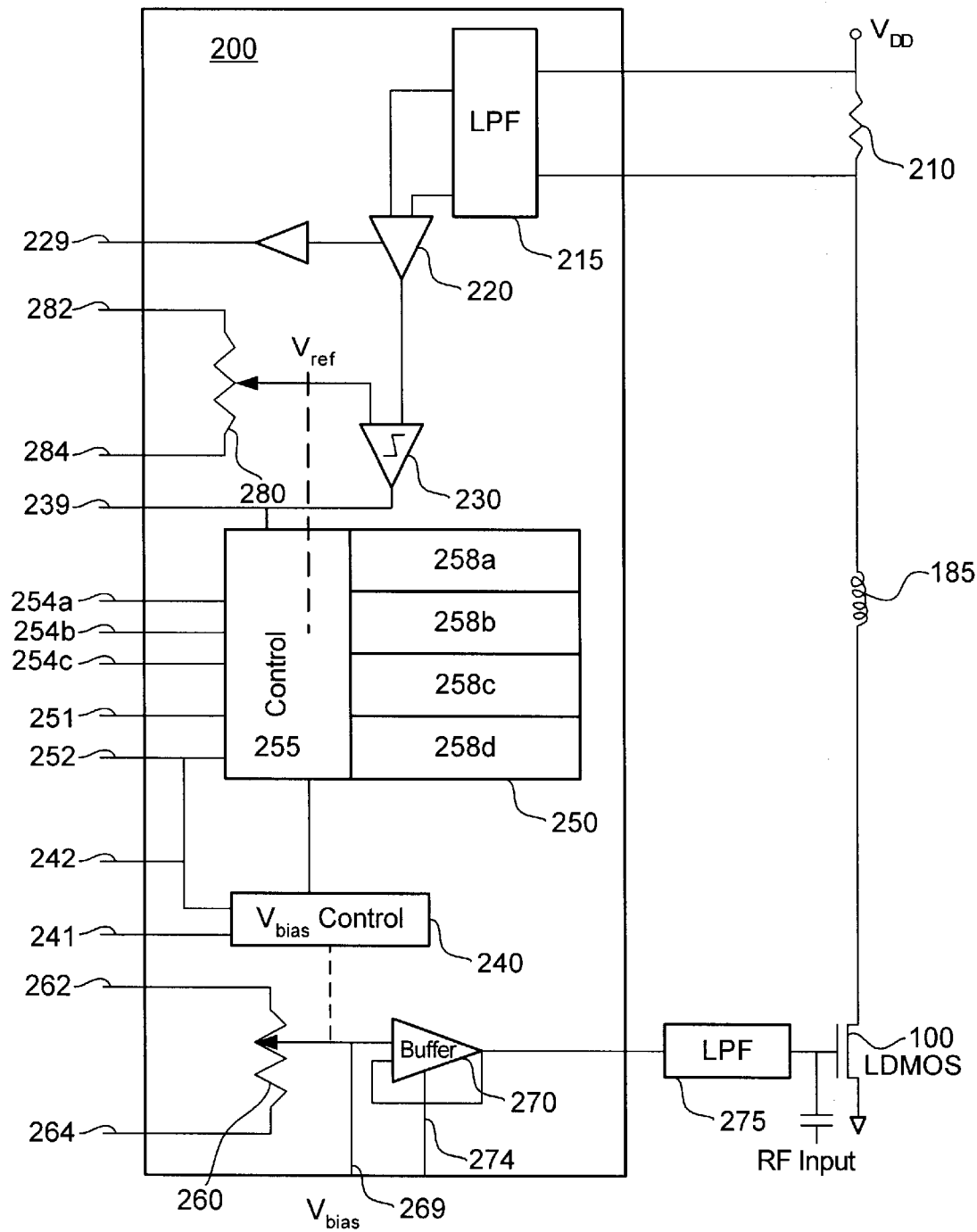
FIG. 4d shows an FET control circuit with two digital potentiometers and a chip controller.

FIG. 4d shows another implementation of an amplifier control circuit 400. Circuit 400 includes a FET 100, an effective load 185, a sensing resistor 210, a low pass filter 215, an instrumentation amplifier 220, a comparator 230, a first digital potentiometer 280, a chip-controller 250, a bias-controller 240, a second digital potentiometer 260, a buffer 270, and a second low pass filter 275.

Low pass filters 215 and 275 isolate the bias control circuit from the RF signals at the gate and drain of FET 100. Circuit 400 also includes a quiescent current monitor-port 229 and a buffer shutdown pin 274. Using quiescent current monitor-port 229 and buffer shutdown pin 274, buffer 274 can be shut down if the quiescent current $I_{DQ}$ is over or under certain ranges. Circuit 400 also includes a circuit comparator monitor-port 239 and a bias monitor-port 269.

Chip-controller 250 can include a control module 255, one or more registers (e.g., registers 258a, 258b, 258c, and 258d), and a chip control interface (e.g., I2C interface)(not shown). In one implementation, the chip control interface of chip-controller 250 includes address bus 254a–254c and data buses 251 and 252. Registers 258a–258d can be used to store the values of a target quiescent current $I_{DQ}$ * or target bias voltage $V_{bias}$. Optionally, registers 258a–258d can also be used to store other chip status and flag information. Registers 258a–258d can either be volatile memory or non-volatile memory (e.g., EEPROM). Using a microprocessor and the chip control interface on chip-controller 250, the target quiescent current $I_{DQ}$ * can be set to one of the values stored in the registers or other external values. $V_{bias}$ can also be can be set to one of the values stored in the registers or other external values.

In the implementation shown in FIG. 4d, four registers 258a–258d are shown. Alternatively, more or fewer than four registers can be used. Slew-rate input 242 is tied to data bus 252. Alternatively, a separate slew-rate input 242 can be provided.

A method and system has been disclosed for controlling power amplifiers. Although the present invention has been described in accordance with the embodiments shown, one of ordinary skill in the art will readily recognize that there could be variations to the embodiments and those variations would be within the spirit and scope of the present invention. For example, the instant invention is applied to power amplifiers with FETs, but the invention can be applied to power amplifiers with other type of transistors (e.g., bipolar transistors). Accordingly, many modifications may be made by one of ordinary skill in the art without departing from the spirit and scope of the appended claims.

What is claimed is:

1. A bias controller comprising:
   a bias detector operable to detect a bias current associated with a device controlled by the bias controller and produce a proportional sensed bias voltage;
   a reference comparator operable to compare the bias voltage to a reference voltage and produce a first control signal operable to adjust a bias output of the bias controller;
   a memory component storing a plurality of reference voltage settings, one for each of a plurality of available modes of operation of the device, the memory component including a mode setting input, a reference voltage output signal and a bias voltage output signal; and
   a reference voltage adjustment circuit adjusting the reference voltage applied to the reference comparator in accordance with the mode of the device as controlled by the reference voltage output signal; and
   a bias adjustment circuit adjusting a bias voltage to be applied to the device in accordance with the mode of the device as controlled by the bias voltage output signal.

2. The bias controller of claim 1 further comprising:
   a potentiometer having a control configured to receive the reference voltage output signal and adjust a wiper position of the potentiometer to produce the first control signal operable to adjust a bias of the bias controller.

3. The bias controller of claim 2 wherein the potentiometer is a digital potentiometer.

4. The bias controller of claim 2 wherein the memory component includes a chip select signal input for selectively disabling the adjustment of the potentiometer and thereby locking the operation of the reference comparator to a single mode of operation.

5. The bias controller of claim 2 further comprising
   a second potentiometer having a control configured to receive the bias voltage output signal and adjust a wiper position of the second potentiometer to produce a second control signal operable to adjust a bias of the bias controller; and
   a buffer configured to receive the second control signal and buffer the second control signal.

6. The bias controller of claim 5 wherein the buffer comprises an operational amplifier.

7. The bias controller of claim 5 wherein the buffer includes a shut down enable interface and is operable to shut down the bias output of the bias controller in response to a shut down signal received on the shut down enable interface of the buffer.

8. The bias controller of claim 1 wherein the bias detector includes an operational amplifier having inputs configured to receive the reference voltage and a sensed bias voltage.

9. The bias controller of claim 1 wherein the device is an LDMOS amplifier.

10. The bias controller of claim 1 wherein the memory component is an EEPROM.

11. The bias controller of claim 1 wherein the memory component includes an external interface for enabling the selection of a mode of the device.

12. A bias controller comprising:
   a bias detector operable to detect a bias current associated with a device controlled by the bias controller and produce a proportional sensed bias voltage;
   a reference comparator operable to compare the bias voltage to a reference voltage and produce a first control signal operable to adjust a bias output of the bias controller;
   a memory component storing a plurality of reference voltage settings, one for each mode of operation of the device, the memory component including a mode setting input and a reference voltage output signal;
   a reference voltage adjustment circuit adjusting the reference voltage applied to the reference comparator in accordance with the mode of the device as controlled by the reference voltage output signal; and wherein the memory component includes an external interface for enabling the selection of a mode of the device and a digital interface including address lines for selecting a mode of the device.

13. The bias controller of claim 1 wherein the reference adjustment circuit includes a potentiometer receiving as an input the reference voltage signal for controlling a wiper position of the potentiometer.

14. The bias controller of claim 13 wherein the potentiometer is a digitally controlled potentiometer.

15. The bias controller of claim 13 wherein the potentiometer includes a chip select signal input for selectively disabling the adjustment of the potentiometer.

16. The bias controller of claim 1 wherein the bias detector includes a voltage divider for adjusting a scale of the bias voltage for use in comparison with the reference voltage.

17. The bias controller of claim 1 wherein the memory component includes an external enable signal for selectively enabling an adjustment of the reference voltage.

18. A bias controller comprising:
  a memory component storing a plurality of bias voltage settings and reference voltage settings, one for each of a plurality of modes of operation of the device, the memory component including a mode setting input, a bias voltage output signal and a reference voltage output signal;
  a first potentiometer having a control configured to receive the bias voltage output signal and adjust a wiper position of the first potentiometer to produce a control signal operable to adjust a bias of the bias controller; and
  a second potentiometer having a control configured to receive the reference voltage output signal and adjust a wiper position of the second potentiometer to produce a control signal operable to adjust a reference voltage of the bias controller.

19. A bias controller comprising:
  a bias detector operable to detect a bias current associated with a device controlled by the bias controller and produce a proportional sensed bias voltage;
  a reference comparator operable to compare the bias voltage to a reference voltage and produce a first control signal operable to adjust a bias output of the bias controller;
  a memory component storing a plurality of reference voltage settings and bias voltage settings, one of each for each mode of operation of the device;
  a reference voltage adjustment circuit adjusting the reference voltage applied to the reference comparator in accordance with the mode of the device as controlled by the reference voltage output signal;
  a bias voltage adjustment circuit adjusting the bias voltage applied to the device in accordance with the mode of the device; and
  a controller having a mode selection input and operable to receive a mode selection and identify an associated bias and reference voltage setting and provide an adjustment signal to one or more of the reference and bias voltage adjustment circuits.

20. A bias controller comprising:
  a memory component storing a plurality of bias voltage settings and reference voltage settings, one for each of a plurality of modes of operation of the device, the memory component including a mode setting input, a bias voltage output signal and a reference voltage output signal;
  a bias adjustment circuit having a control configured to receive the bias voltage output signal and adjust a bias of the bias controller; and
  a reference adjustment circuit having a control configured to receive the reference voltage output signal and adjust a reference voltage of the bias controller.

* * * * *